United States Patent [19]

Edmonson et al.

[11] Patent Number: 5,063,120
[45] Date of Patent: Nov. 5, 1991

[54] THIN FILM MAGENTIC MEDIA

[75] Inventors: David A. Edmonson; Peter R. Ivett; Kenneth E. Johnson, all of Rochester, Minn.; Seyyed M. T. Mirzamaani, Croton-on-Hudson, N.Y.; James F. Ward, Jr., Rochester, Minn.

[73] Assignee: International Business Machines Corporation, Armonk, N.Y.

[21] Appl. No.: 503,070

[22] Filed: Mar. 27, 1990

Related U.S. Application Data

[63] Continuation of Ser. No. 160,056, Feb. 25, 1988, abandoned.

[51] Int. Cl.$^5$ ............................................. G11B 5/66
[52] U.S. Cl. ........................................ 428/694; 428/900; 428/928
[58] Field of Search ...................... 428/694, 900, 928

[56] References Cited

U.S. PATENT DOCUMENTS

| | | | |
|---|---|---|---|
| 4,438,066 | 3/1984 | Aboaf | 428/606 |
| 4,632,883 | 12/1986 | Howard et al. | 428/694 |
| 4,652,499 | 3/1987 | Howard | 428/680 |
| 4,654,276 | 3/1987 | Ahlert et al. | 428/680 |
| 4,657,824 | 4/1987 | Howard | 428/611 |
| 4,735,840 | 4/1988 | Hedgloth | 428/900 |
| 4,745,005 | 5/1988 | Sugita et al. | 428/694 |
| 4,749,628 | 6/1988 | Ahlert et al. | 428/694 |
| 4,789,598 | 12/1988 | Howard et al. | 428/928 |
| 4,808,489 | 2/1989 | Abe et al. | 428/694 |
| 4,828,905 | 5/1989 | Wada et al. | 428/694 |
| 4,833,020 | 5/1989 | Shiroishi et al. | 428/900 |
| 4,902,583 | 2/1990 | Brucker et al. | 428/928 |

FOREIGN PATENT DOCUMENTS

| | | |
|---|---|---|
| 141435 | 8/1983 | Japan . |
| 121530 | 6/1985 | Japan . |
| 227222 | 10/1986 | Japan . |
| 236116 | 10/1987 | Japan . |

Primary Examiner—Merrell C. Cashion, Jr.
Assistant Examiner—Robert S. Follett
Attorney, Agent, or Firm—Robert W. Lahtinen

[57] ABSTRACT

A fabrication method and structure for a cobalt alloy thin film magnetic recording media uses an underlayer of sputter deposited chromium having a thickness of 50 to 200 angstroms which presents the (100) plane of the chromium atoms at the surface upon which the cobalt alloy magnetic thin film layer is to be deposited. The cobalt alloy hexagonal close packed atomic structure is sputtered onto the chromium underlayer and epitaxially grown such that the (110) plane of the cobalt alloy structure is parallel to the media surface. This disposes the cobalt magnetic layer structure to have the C axis (easiest axis of the magnetization) parallel to the media surface to optimize horizontal recording density.

5 Claims, 4 Drawing Sheets

— CR

— CO

THIN FILM MAGENTIC MEDIA

This is a continuation of application Ser. No. 160,056, filed Feb. 25, 1988, now abandoned.

FIELD OF THE INVENTION

The invention pertains to thin film cobalt alloy magnetic media and more particularly to media structure and method of fabrication wherein the magnetic recording layer atoms are oriented with the axis of easiest magnetization parallel to the media surface for optimum recording density.

BACKGROUND OF THE INVENTION

In seeking higher areal recording densities on rigid magnetic disk surfaces, it is known that thin film media has significant advantages over particulate disk media technology. Thin film media have higher remanence (Mr) values, the measure of the magnetic strength of the material, because there is no dilution of magnetization by non-magnetic polymer binders. Further, magnetic films are naturally stronger magnetic materials than the oxide particles used in particulate films.

Producing a good thin film magnetic disk involves more than depositing a uniform thickness metallic, magnetic layer. Magnetic anisotropy (the tendency for a material to magnetize in a specific direction) must be rigidly controlled. If this is not done, degrading effects such as modulation in the readback signal can occur. One of the keys to producing a suitable magnetic film for longitudinal recording is to assure that the magnetic anisotropy is in plane. To optimize use of the in plane orientation it is further necessary to have the magnetic orientation random or circumferential as well as in plane to overcome signal variation or modulation during disk rotation. This preferential horizontal alignment is necessary to produce high squareness hysteresis curves which in turn lead to high density recording capabilities.

SUMMARY OF THE INVENTION

To optimize the magnetic properties of the thin film cobalt alloy media for horizontal recording, it is necessary that the hexagonal close packed cobalt atoms be oriented with the c axis parallel to the recording surface. This requires that the cobalt atoms attach to the exposed underlayer surface along the cobalt (110) or (100) planes. By providing a chromium underlayer with the (100) plane of the chromium atoms parallel to the recording surface, the cobalt alloy atoms are able to attach to the chromium structure along the (110) plane.

The atomic alignment to obtain optimum recording properties can be controlled by several factors, but a major contributor is the identity, orientation and thickness of the underlayer. The deposition of a thin (100 angstrom) chromium underlayer under high rate sputtering conditions (>1000 angstroms per minute) results in a so called (110) orientation which allows a cobalt alloy film, such as cobalt-platinum or cobalt-platinum-chromium, to grow epitaxially with its easy axis of magnetization, the c axis, in plane.

It is also desirable to have the easy axis of magnetization either randomly or circumferentially aligned to optimize the magnetic characteristics and avoid modulation of the readback signal. The squareness of the media (S=Mr/Ms) is a measure of the magnetic quality of the magnetic layer. Large values, approaching unity, are desirable, indicating the potential for high signal strength and short transitions. The squareness (S) is determined by the magnetic layer material system selected and by the orientation of the easy axis of magnetization.

DETAILED DESCRIPTION

Figure 1:
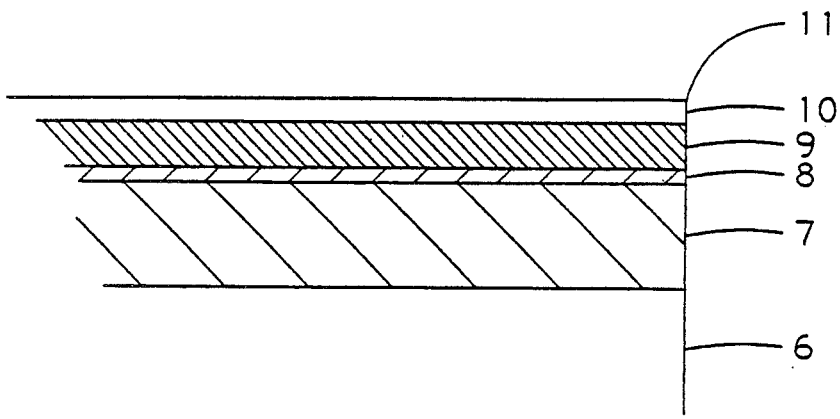
FIG. 1 is a section view of a magnetic film in accordance with the present invention.

FIG. 1 shows a section view of the thin film disk of the present invention. As in substantially all current rigid disk products, the disks magnetic coating is placed over an aluminum alloy substrate. In a typical disk having a 130 mm outside diameter the substrate has a thickness of 1.9 mm. The initial layer overlying the substrate is a deposit of hard nickel-phosphorous (NiP) which is electroless plated over the aluminum surface. The surface thus provided is equivalent in hardness to carbon steel (600 kg/mm**2) and serves as a firm base for the very thin and fragile magnetic layer. In addition, the NiP allows the creation of a very smooth and controlled surface finish via abrasive processing that a soft aluminum surface alone could not provide. The surface morphology of the polished NiP is replicated by succeeding layers of the disk structure. The final disk surface must be free of asperities to allow recording heads to fly close and to minimize head disk interactions that can accelerate disk wear.

The aluminum substrate is first polished to a high degree of smoothness (40 angstroms RMS). Optionally, a circumferential texture may be imparted to the surface (65 angstroms RMS measured radially) which serves to reduce stiction and friction while at the same time improving magnetic properties due to preferential grain alignment along the circumferential grooves. Even with the added surface texture, the resultant disk surface uniformity and roughness still allows a recording head to fly at seven microinches at the inner diameter without encountering interference or interactions.

Following the preparation of the NiP surface, a chromium underlayer, a ferromagnetic cobalt alloy magnetic layer and a protective over coating are sequentially applied by sputter deposition within a single sputtering apparatus. The entire process can be accomplished using an inline process where a vertical pallet supporting multiple disks is sputtered over the course of several minutes to produce a large quantity of disks at low cost with very uniform film thicknesses and magnetic properties. After emerging from the sputtering step, a lubricant organic monolayer is deposited in specially designed equipment under tightly controlled temperature conditions.

To produce a thin film disk for high density recording it is not in itself sufficient to apply a uniform smooth film of ferromagnetic recording material. The atoms of the recording material layer must be oriented with the easy axis of magnetization parallel to the surface of the disk in devices that use horizontal recording. This presents some difficulty when using cobalt alloy recording materials since the c axis of the hexagonal close packed molecule structure is prone to position vertically rather than horizontally during most material application techniques.

Figure 2:
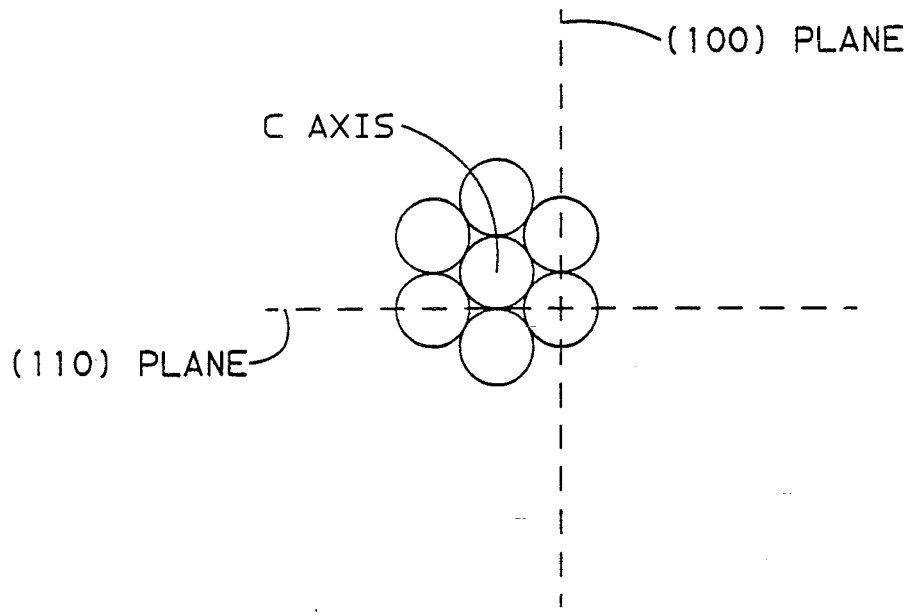
FIG. 2 is a schematic representation of a cobalt alloy hexagonal close packed structure and the C axis and (100) and (110) planes associated therewith.

It has been found that by applying a thin underlayer of chromium with the (100) (one, zero, zero) plane at the surface upon which the ferromagnetic cobalt alloy recording material is to be applied, conditions can be controlled to cause the cobalt alloy (110) (one, one, zero) plane attach to the (100) plane of the chromium underlayer. This disposes the cobalt alloy c axis or axis of easy magnetization parallel to the disk surface, in the optimum orientation for horizontal recording. As shown in FIG. 2, the hexagonal close packed configuration of the cobalt alloy ferromagnetic material has a central atom surrounded by six atoms in a tightly proximate relation. The c axis is perpendicular to the figure at the center point as shown. This is the axis of easiest magnetization. The c axis can be positioned in the desired horizontal orientation by having the cobalt alloy structure attach to the chromium underlayer along the (100) or (110) planes, which are planes vertical to the figure through the broken lines indicated. The (100) plane will not combine with the chromium underlayer to form a planar c axis orientation. The spacing of the cobalt alloy atoms will not align with the (100) plane of the chromium atoms to afford epitaxial growth of the cobalt alloy crystal structure. chromium coating surface. However, the (110) plane of the cobalt alloy presents an atomic spacing almost ideally matched to the (100) surface of the chromium underlayer.

Figure 3:
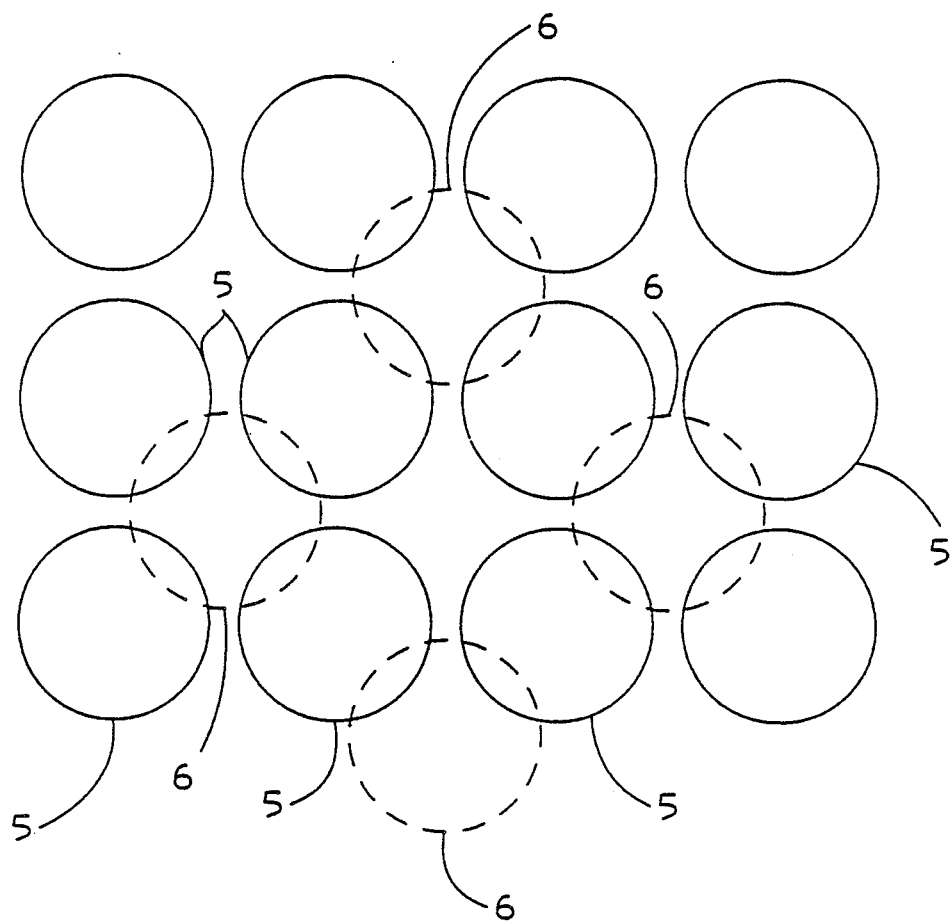
FIG. 3 is a schematic illustration showing the atoms at the interface between chromium underlayer (100) plane and the cobalt media (110) plane.

FIG. 3 is a schematic showing of the interface between the thin film chromium underlayer and the cobalt alloy magnetic thin film. The chromium atoms (solid line circles 5) at the underlayer surface, have a pattern as shown when the (100) is presented. The hexagonal close packed cobalt atomic structure with the (110) planes parallel to the paper fit well into the interstitial locations of the chromium (100) surface as shown by the broken line circles 6. Thus the formation of a chromium film with the atomic (100) planes parallel to the exposed surface induces epitaxial growth of the cobalt magnetic material with the (110) plane parallel to the media surface to place the C axis or easy axis of magnetization parallel to the media surface.

Figure 4:
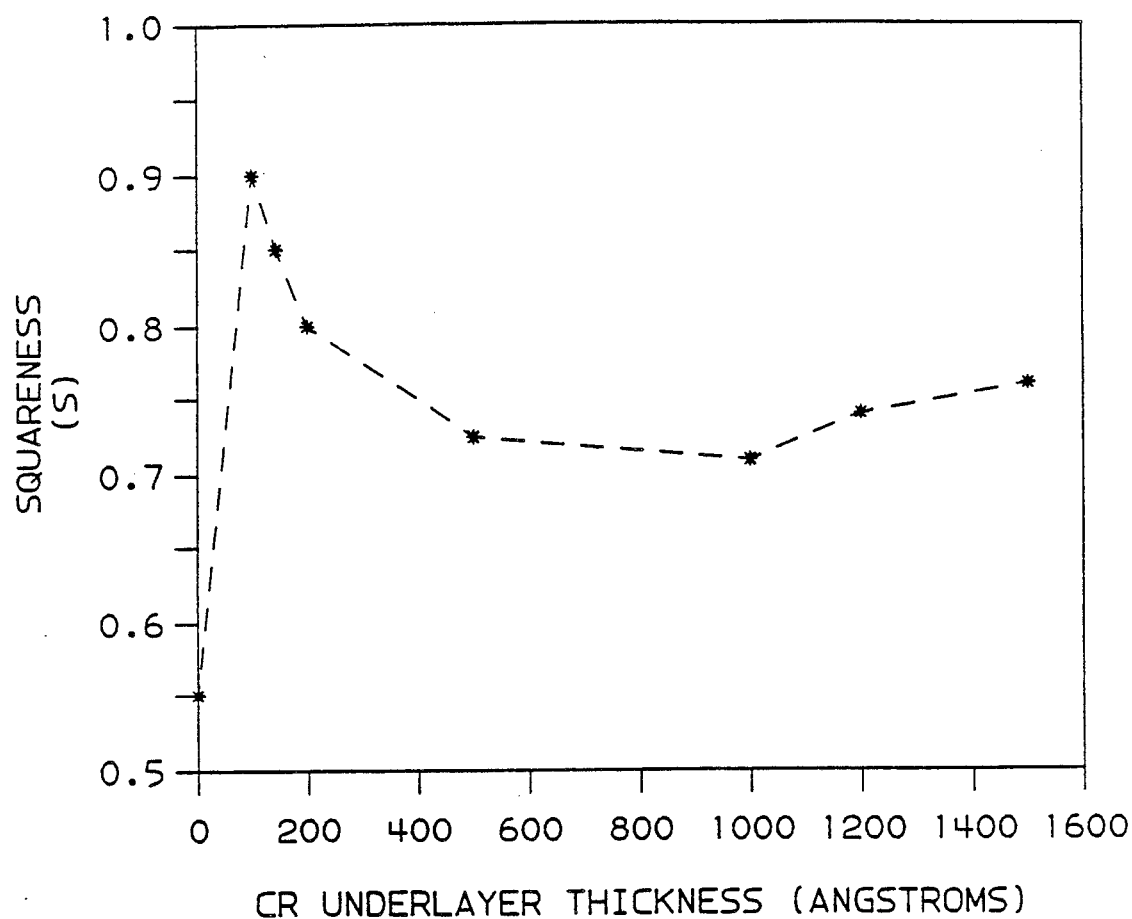
FIG. 4 is a graph showing squareness as a function of chromium underlayer thickness which is obtained practicing the present invention.

It has been found that by sputtering the chromium underlayer at a high rate of 1000 to 4000 angstroms per minute and at an elevated temperature of >150 degrees centigrade to produce a thickness of 50 to 200 angstroms, the chromium underlayer will be deposited with the desired (100) plane at the underlayer surface. As seen in the graph of FIG. 4, the maximum amount of squareness occurs with the use of an underlayer thickness within the 50 to 200 angstrom range. With thicker layers the chromium crystal structure tends to randomize and favor other planes in addition to the (100).

The ferromagnetic cobalt alloy recording layer is then sputter deposited within the same apparatus without exposure to the atmosphere which can alter the chromium atomic orientation or chemically change the chromium underlayer by oxidization. The sputtered ferromagnetic layer grows epitaxially with the C axis, the easy axis of magnetization parallel to the surface of the disk. Upon completing application of the thin film recording layer, the protective coating is also applied within the same apparatus. However, since the protective coating effectiveness is not dependent upon atomic orientation, the conditions of application are not as demanding as those of the magnetic recording film and the chromium underlayer.

In a longitudinal recording system, it is not only beneficial that the easy axis of magnetization be in plane and parallel to the recording surface, but also be circumferentially oriented to optimize the recording capabilities. The circumferential orientation can be enhanced by texturing the disk recording surface. The unsputtered, hard surfaced, polished substrate is provided with concentric, circular microgrooves to provide a flat polished planar land surface that is interrupted periodically by circumferential grooves. The planar surface is polished or finished to a smoothness wherein the asperities do not exceed 40 angstroms. The grooves that afford the texturing have a depth not exceeding 100 angstroms, with the average depth less than 90 angstroms.

The texturing that affords other benefits also forms a part of the surface that is replicated by the sputtered chromium and thin film magnetic media coatings and influences the deposition of the epitaxially grown magnetic layer to induce a circumferential orientation of the magnetic domain easy axis of magnetization.

What is claimed is:
1. A thin film rigid magnetic recording media comprising
    a rigid nonferromagnetic substrate;
    a chromium underlayer of 50 to 200 angstroms thickness with the (100) plane of the body centered cubic structure parallel to the recording surface and
    a ferromagnetic thin film cobalt alloy magnetic coating epitaxially grown from said chromium underlayer (100) plane with the cobalt alloy (110) plane parallel to said recording surface, whereby the cobalt alloy hexagonal close packed atomic structure has the C axis substantially parallel to said recording surface.

2. The thin film magnetic recording media of claim 1 wherein said rigid nonferromagnetic substrate comprises an aluminum disk having a coating of Nip that is polished to a smoothness such that asperities do not exceed 40 angstroms.

3. The thin film magnetic recording media of claim 2 further comprising a textured surface applied to the Nip material polished surface as substantially concentric circular grooves not exceeding 100 angstroms in depth whereby the atomic structure of said chromium and ferromagnetic thin films are induced to be deposited with the ferromagnetic thin film easy axis of magnetization aligned in the circumferential direction.

4. The thin film magnetic recording media of claim 2 further comprising a sputtered protective coating overlying said ferromagnetic thin film cobalt alloy magnetic coating.

5. The thin film magnetic recording media of claim 4 wherein said ferromagnetic thin film cobalt alloy coating is cobalt-platinum-chromium including at least 70 atomic percent cobalt.

* * * * *